(12) United States Patent
Uemura

(10) Patent No.: US 11,309,047 B2
(45) Date of Patent: Apr. 19, 2022

(54) TEST CIRCUIT USING CLOCK SIGNALS HAVING MUTUALLY DIFFERENT FREQUENCY

(71) Applicant: MICRON TECHNOLOGY, INC., Boise, ID (US)

(72) Inventor: Yutaka Uemura, Hachioji (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/020,529

(22) Filed: Sep. 14, 2020

(65) Prior Publication Data

US 2022/0084615 A1  Mar. 17, 2022

(51) Int. Cl.
*G11C 29/00* (2006.01)
*G11C 29/12* (2006.01)
*G11C 29/14* (2006.01)

(52) U.S. Cl.
CPC ...... *G11C 29/12015* (2013.01); *G11C 29/14* (2013.01)

(58) Field of Classification Search
CPC ... G11C 29/12015; G11C 29/14; G11C 29/12; G11C 29/20; G01R 31/31725; G01R 31/31726; G01R 31/31727; G01R 31/3187
See application file for complete search history.

(56) References Cited

U.S. PATENT DOCUMENTS

| | | | |
|---|---|---|---|
| 7,269,772 B1* | 9/2007 | Li | G01R 31/31725 714/731 |
| 2005/0188290 A1* | 8/2005 | Motika | G01R 31/311 714/733 |
| 2015/0219717 A1* | 8/2015 | Ahrens | G01R 31/3177 714/727 |
| 2017/0336472 A1* | 11/2017 | Tsai | G01R 31/318588 |
| 2019/0385692 A1* | 12/2019 | Nakaoka | G11C 29/81 |

* cited by examiner

*Primary Examiner* — Christine T. Tu
(74) *Attorney, Agent, or Firm* — Dorsey & Whitney LLP

(57) ABSTRACT

Disclosed herein is an apparatus that includes first and second shift register circuits coupled in series, the first and second shift register circuits being configured to perform a shift operation of a trigger signal in synchronization with a clock signal, and a clock control circuit configured to set a frequency of the clock signal to a first frequency when the trigger signal is in the first shift register circuit and set a frequency of the clock signal to a second frequency different from the first frequency when the trigger signal is in the second shift register circuit.

20 Claims, 5 Drawing Sheets

US 11,309,047 B2

TEST CIRCUIT USING CLOCK SIGNALS HAVING MUTUALLY DIFFERENT FREQUENCY

BACKGROUND

Some semiconductor memory devices such as a DRAM (Dynamic Random-Access Memory) include a test circuit called mBist that automatically performs a test of memory cells inside a chip. The test of memory cells using mBist is performed in synchronization with an internal clock signal having a predetermined frequency.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
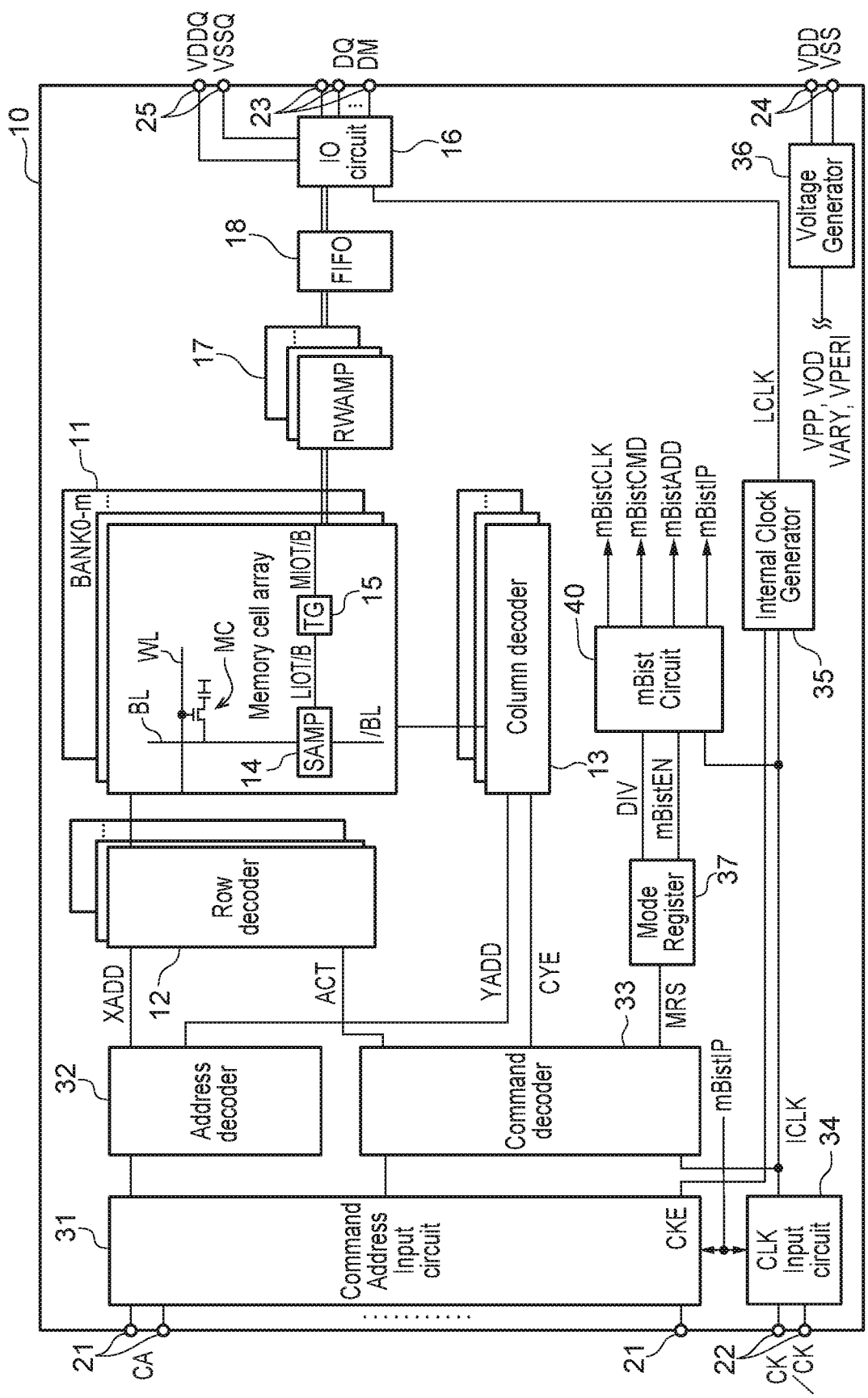
FIG. 1 is a block diagram of a semiconductor device according to an embodiment of the present disclosure.

FIG. 1 is a block diagram of a semiconductor device 10 according to one embodiment of the present disclosure. The semiconductor device 10 can be, for example, a DDR4 SDRAM (Double-Data-Rate 4 Synchronous Dynamic Random-Access Memory) incorporated into a single semiconductor chip. The semiconductor device 10 may be mounted on an external substrate such as a memory module substrate or a motherboard. As shown in FIG. 1, the semiconductor device 10 includes a memory cell array 11. The memory cell army 11 includes a plurality of word lines WL, a plurality of bit lines BL, and a plurality of memory cells MC respectively provided at intersections between the word lines WL and the bit lines BL. Selection of the word lines WL is performed by a row decoder 12 and selection of the bit lines BL is performed by a column decoder 13. A sense amplifier 14 is coupled to a corresponding one of the bit lines BL and a local I/O line pair LIOT/B. The local I/O line pair LIOT/B is coupled to a main I/O line pair MIOT/B via a transfer gate 15 that functions as a switch. The memory cell array 11 is divided into m+1 memory banks including memory banks BANK0 to BANKm.

A plurality of external terminals included in the semiconductor device 10 include a command address terminal 21, a clock terminal 22, a data terminal 23, and power terminals 24 and 25. The data terminal 23 is coupled to an I/O circuit 16.

A command address signal CA is supplied to the command address terminal 21. A signal related to an address in the command address signal CA supplied to the command address terminal 21 is transferred to an address decoder 32 via a command address input circuit 31, and a signal related to a command is transferred to a command decoder 33 via the command address input circuit 31. The address decoder 32 decodes the address signal to generate a row address XADD and a column address YADD. The row address XADD is supplied to the row decoder 12 and the column address YADD is supplied to the column decoder 13. An access control circuit may include circuits used to access the memory cell array 11, for example, the address decoder 32, command decoder 33, row decoder 12, and/or column decoder 13, by using an internal address signal and internal commands. A clock enable signal CKE in the command address signal CA is supplied to an internal clock generator 35.

Complementary external clock signals CK and /CK are supplied to the clock terminal 22. The complementary external clock signals CK and /CK are input to a clock input circuit 34. The clock input circuit 34 generates an internal clock signal ICLK based on the complementary external clock signals CK and /CK. The internal clock signal ICLK is supplied to at least the command decoder 33, the internal clock generator 35, and a test circuit (mBist circuit) 40. The internal clock generator 35 is activated, for example, by the clock enable signal CKE and generates an internal clock signal LCLK based on the internal clock signal ICLK. The internal clock signal LCLK is supplied to the I/O circuit 16. The internal clock signal LCKL is used as a timing signal that defines a timing when read data DQ is to be output from the data terminal 23 in a read operation. In a write operation, write data is input from outside to the data terminal 23. A data mask signal DM may be input from outside to the data terminal 23 in the write operation.

Power potentials VDD and VSS are supplied to the power terminal 24. These power potentials VDD and VSS are supplied to a voltage generator 36. The voltage generator 36 generates various internal potentials VPP, VOD, VARY, VPERI, and the like based on the power potential VDD and VSS. The internal potential VPP is mainly used in the row decoder 12, the internal potentials I/OD and VARY are mainly used in the sense amplifiers 14 included in the memory cell army 11, and the internal potential VPERI is used in other many circuit blocks.

Power potentials VDDQ and VSSQ are supplied from the power terminal 25 to the I/O circuit 16. Although the power potentials VDDQ and VSSQ can be same as the power potentials VDD and VSS supplied to the power terminal 24, respectively, dedicated power potentials VDDQ and VSSQ are allocated to the I/O circuit 16 to prevent power-supply noise that occurs in the I/O circuit 16 from propagating to other circuit blocks.

The command decoder 33 activates an active signal ACT when an active command is issued. The active signal ACT is supplied to the row decoder 12. When a read command or a write command is issued from outside following the active command, the command decoder 33 activates a column selection signal CYE. The column selection signal CYE is supplied to the column decoder 13 and a corresponding one of the sense amplifiers 14 is activated in response thereto. Accordingly, read data is read from the memory cell array 11 in the read operation. The read data having been read from the memory cell array 11 is transferred to the I/O circuit 16 via a read/write amplifier 17 and a FIFO (First-In First-Out) circuit 18 and is output from the data terminal 23 to outside. In the write operation, write data having been input from outside via the data terminal 23 is written into the memory cell array 11 via the I/O circuit 16, the FIFO circuit 18, and the read/write amplifier 17.

The command decoder 33 activates a mode register set signal MRS when a mode register set command is issued. The mode register set signal MRS is supplied to a mode register 37. When the mode register set signal MRS is activated, various control parameters stored in the mode register 37 are overwritten. The control parameters stored in the mode register 37 include a division signal DIV. When a test command is issued from outside, the mode register 37 outputs an enable signal mBistEN. The division signal DIV and the enable signal mBistEN are supplied to the test circuit 40.

Figure 2:
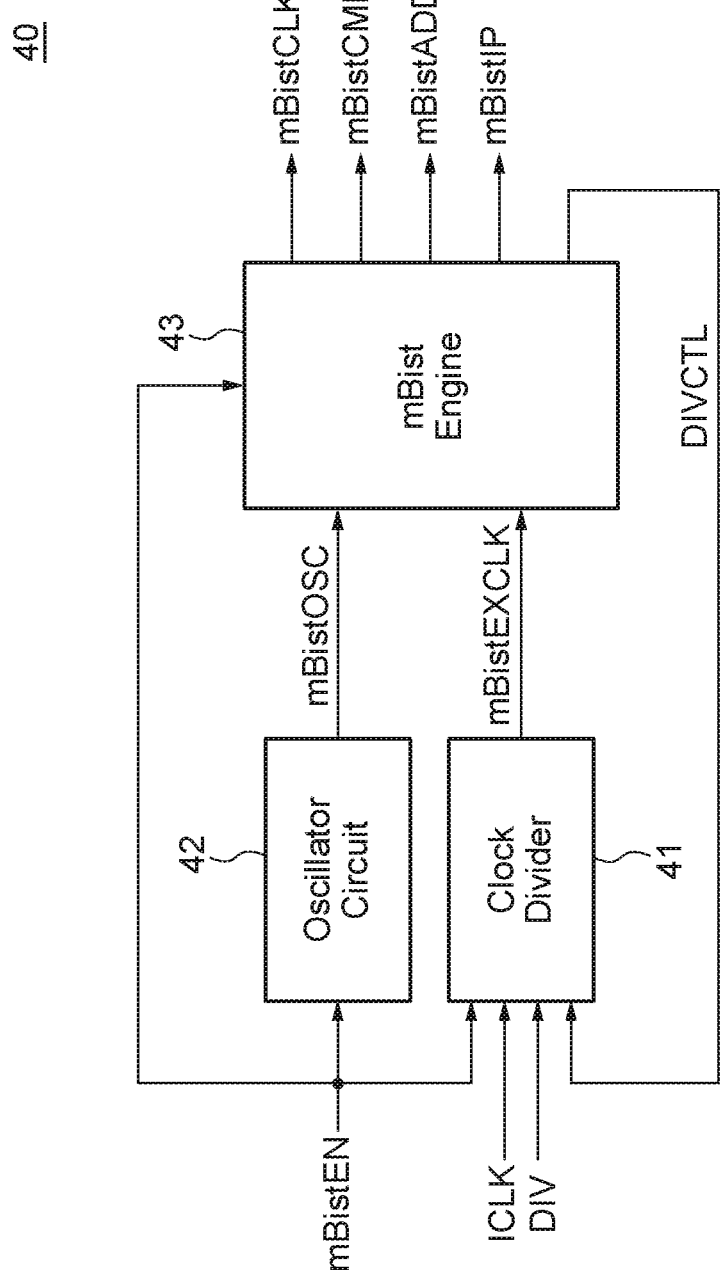
FIG. 2 is a block diagram of a test circuit according to an embodiment of the present disclosure.

FIG. 2 is a block diagram of a test circuit according to an embodiment of the present disclosure. As shown in FIG. 2, the test circuit 40 includes a clock divider circuit 41, an oscillator circuit 42, and an mBist engine 43. The clock divider circuit 41, the oscillator circuit 42, and the mBist engine 43 are activated by the enable signal mBistEN. The enable signal mBistEN is activated when a test operation using the test circuit 40 is to be performed. When the clock divider circuit 41 is activated, a divided clock signal mBistEXCLK is generated. The divided clock signal mBistEXCLK is a signal obtained by dividing the internal clock signal ICLK and the division ratio thereof is designated by the division signal DIV or DIVCTL. The division signal DIV may be one of the control parameters set in the mode register 37. The division signal DIVCTL is generated by the mBist engine 43. When the oscillator circuit 42 is activated, an oscillator signal mBistOSC having a predetermined frequency is generated. The divided clock signal mBistEXCLK and the oscillator signal mBistOSC are input to the mBist engine 43. The mBist engine 43 automatically generates a clock signal mBistCLK for a test, an internal command mBistCMD for a test, and an internal address mBistADD for a test in synchronization with the divided clock signal mBistEXCLK or the oscillator signal mBistOSC. Accordingly, when the mBist engine 43 is activated, an automatic operation test for the memory cell array 11 is performed. During a period in which the operation test using the mBist engine 43 is performed, a state signal mBistIP is kept activated. The state signal mBistIP is supplied to the command address input circuit 31 and the clock input circuit 34 shown in FIG. 1. When the state signal mBistIP is activated, the command address input circuit 31 and the clock input circuit 34 are inactivated, whereby current consumption due to operations of the command address input circuit 31 and the clock input circuit 34 is reduced.

Figure 3:
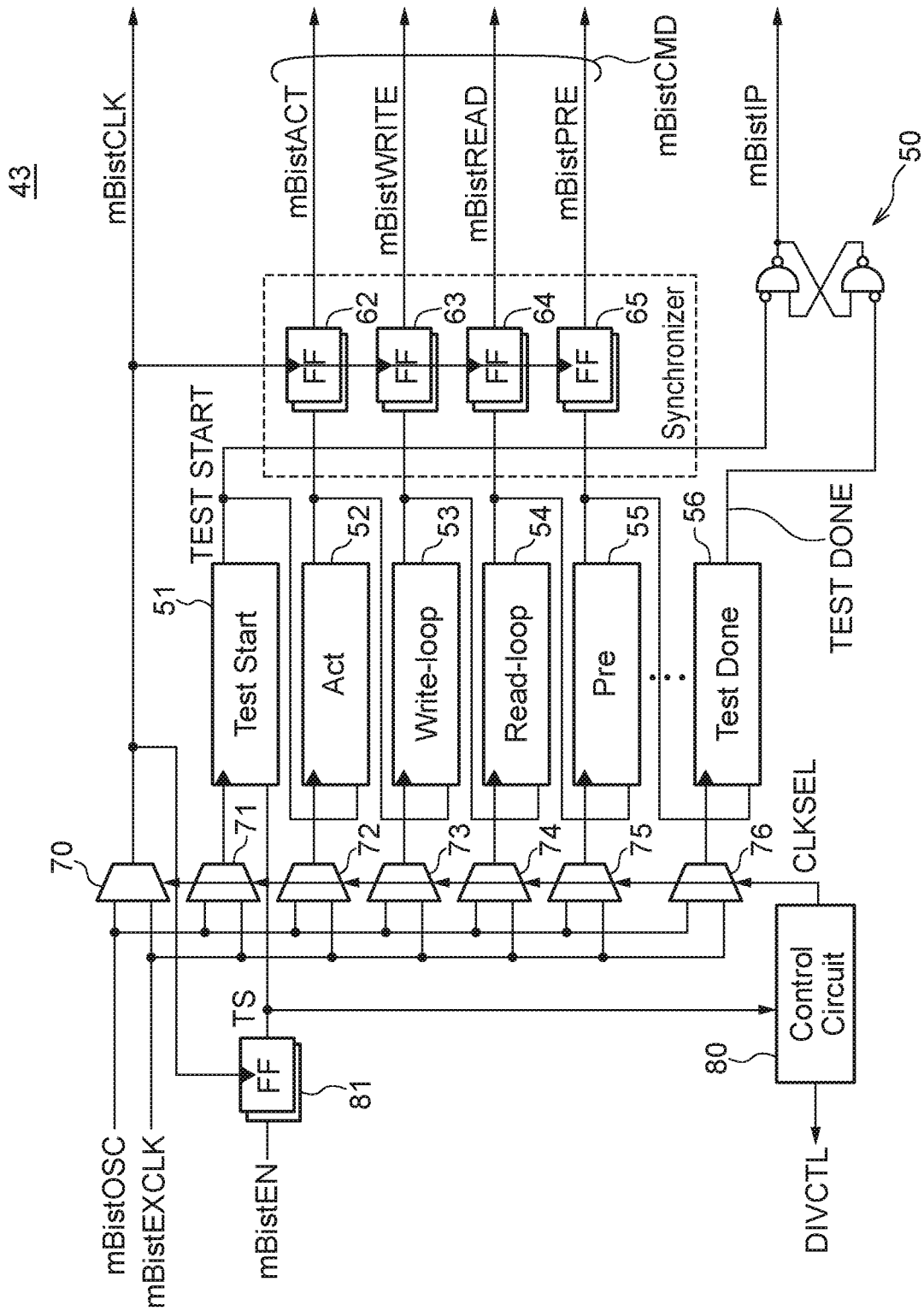
FIG. 3 is a block diagram of a mBist engine according to an embodiment of the present disclosure.

FIG. 3 is a block diagram of a mBist engine according to an embodiment of the present disclosure. As shown in FIG. 3, the mBist engine 43 includes a plurality of shift registers 51 to 56 cascade-coupled. The shift register 51 generates a start signal TEST START that defines a start timing of a test operation, the shift registers 52 to 55 generate the internal commands mBistCMD for a test, and the shift register 56 generates an end signal TEST DONE that defines an end timing of a test operation. The start signal TEST START and the end signal TEST DONE are supplied to a SR latch circuit 50. The SR latch circuit 50 activates a state signal mBistIP responsive to the start signal TEST START and inactivates the state signal mBistIP responsive to the end signal TEST DONE. As an example, the shift registers 52 to 55 generate an active signal mBistACT for a test, a write signal mBistWRITE for a test, a read signal mBistREAD for a test, and a precharge signal mBistPRE for a test, respectively. Because the shift registers 52 to 55 are cascade-coupled, the active signal mBistACT for a test, the write signal mBistWRITE for a test, the read signal mBistREAD for a test, and the precharge signal mBistPRE for a test are automatically generated in this order from synchronizers 62 to 65, respectively, in synchronization of the clock signal mBistCLK for a test when the mBist engine 43 starts.

The mBist engine 43 further includes multiplexers 70 to 76. The multiplexers 70 to 76 all receive the divided clock signal mBistEXCLK and the oscillator signal mBistOSC, and output either the divided clock signal mBistEXCLK or the oscillator signal mBistOSC on the basis of a clock selection signal CLKSEL output from a control circuit 80. As shown in FIG. 3, the clock selection signal CLKSEL is supplied in common to the multiplexers 70 to 76 and therefore clock signals output from the multiplexers 70 to 76 are same. The output from the multiplexer 70 is used as the clock signal mBistCLK for a test. The outputs from the multiplexers 71 to 76 are supplied to the shift registers 51 to 56, respectively. Accordingly, the shift registers 51 to 56 perform shift operations synchronized with the clock signals output from the multiplexers 71 to 76. The clock signal mBistCLK output from the multiplexer 70 is also supplied to a synchronizer 81. The synchronizer 81 synchronizes the enable signal mBistEN with the clock signal mBistCLK and outputs the synchronized signal as a trigger signal TS.

The trigger signal TS is first supplied to the shift register 51. When the trigger signal TS is supplied to the shift register 51, the shift register 51 shifts the trigger signal TS in synchronization with the clock signal mBistCLK. When the clock signal output from the multiplexer 71 has been clocked a predetermined number of times, the trigger signal TS is output from the shift register 51 and is input to the shift register 52 at the subsequent stage. In this way, the trigger signal TS is transferred while being shifted to the shift registers 51 to 56 in this order in synchronization with the clock signal mBistCLK.

Figure 4:
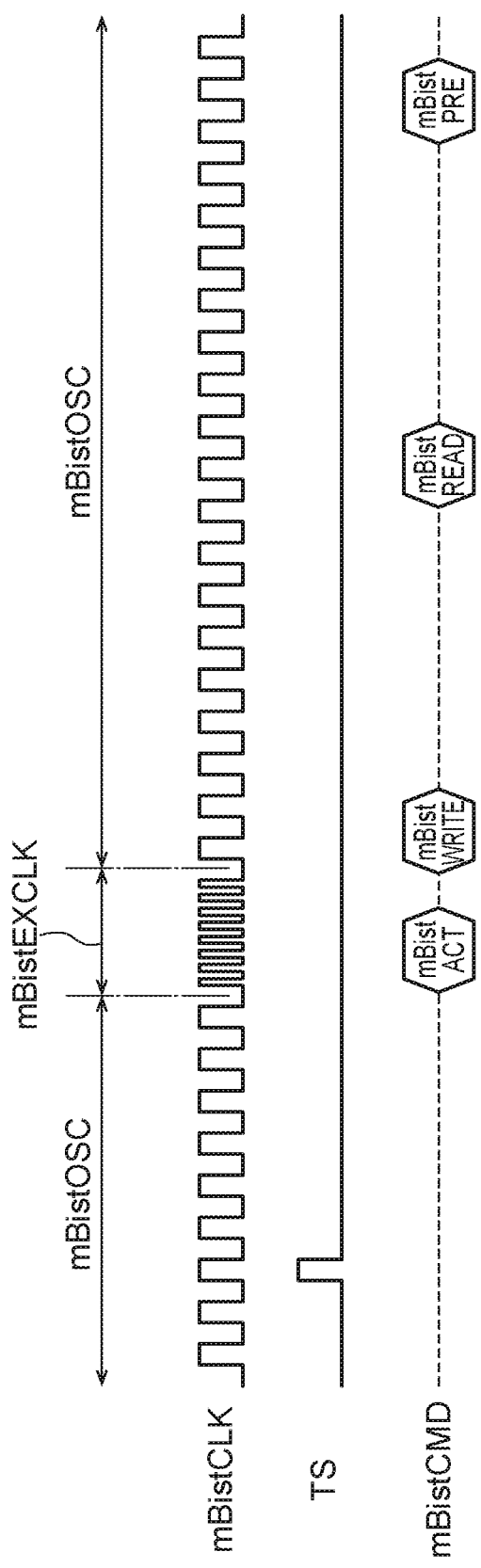
FIG. 4 is a timing chart showing an example of an operation of the mBist engine according to an embodiment of the present disclosure.

The control circuit 80 switches the clock selection signal CLKSEL in the middle of shifting of the trigger signal TS in the shift registers 51 to 56. As an example, the control circuit 80 is set to cause the multiplexers 70 to 76 to select the oscillator signal mBistOSC in a period in which the trigger signal TS is in the shift registers 51, 52, and 54 to 56, and to cause the multiplexers 70 to 76 to select the clock signal mBistEXCLK in a period in which the trigger signal TS is in the shift register 53. Accordingly, the operation is determined by the frequency of the clock signal mBistEXCLK in a period from when the active signal mBistACT is activated until when the write signal mBistWRITE is activated, and is determined by the frequency of the oscillator signal mBistOSC in other periods as shown in FIG. 4. FIG. 4 is a timing chart showing an example of an operation of the mBist engine according to an embodiment of the present disclosure. A timing at which the clock selection signal CLKSEL is to be switched can be changed by setting of the control circuit 80. For example, the current location of the trigger signal TS can be known if the trigger signals TS output from the shift registers 51 to 56 are supplied to the control circuit 80, and therefore the clock selection signal CLKSEL may be switched at any timing based on the current location of the trigger signal TS. The control circuit 80 may supply a divided signal DIVCTL to the clock divider circuit 41. This enables the division ratio of the clock divider circuit 41 to be dynamically changed by the control circuit 80.

In this way, the test circuit 40 according to the present embodiment can automatically generate the internal commands mBistCMD for a test and can switch the frequency of a clock signal for each command. For example, citing a period tWR from issuance of a write command to issuance of a precharge command, an adjustable minimum step of the period tWR is 5 nanoseconds when the period of the oscillator signal mBistOSC is 5 nanoseconds. However, when an external clock CK is used, the period tWR can be set to any length according to the frequency of the used external clock signal CK. Therefore, when the clock signal mBistEXCLK is selected for a portion related to a sequence of the period tWR and the oscillator signal mBistOSC is selected for other sequences, only the period tWR can be adjusted to any length while the stability of the circuit operation is secured. In a case of compressing read data in read operations using the test circuit 40, a certain analog time including a compression operation is required to complete a series of read operations. Therefore, an operation failure may occur if the frequency of the clock signal mBistCLK is increased for the purpose of shortening the test time. In this case, the oscillator signal mBistOSC is selected for a sequence related to reading and the clock signal mBistEXCLK is selected for other sequences, so that the test time can be shortened without generating any operation failure.

Figure 5:
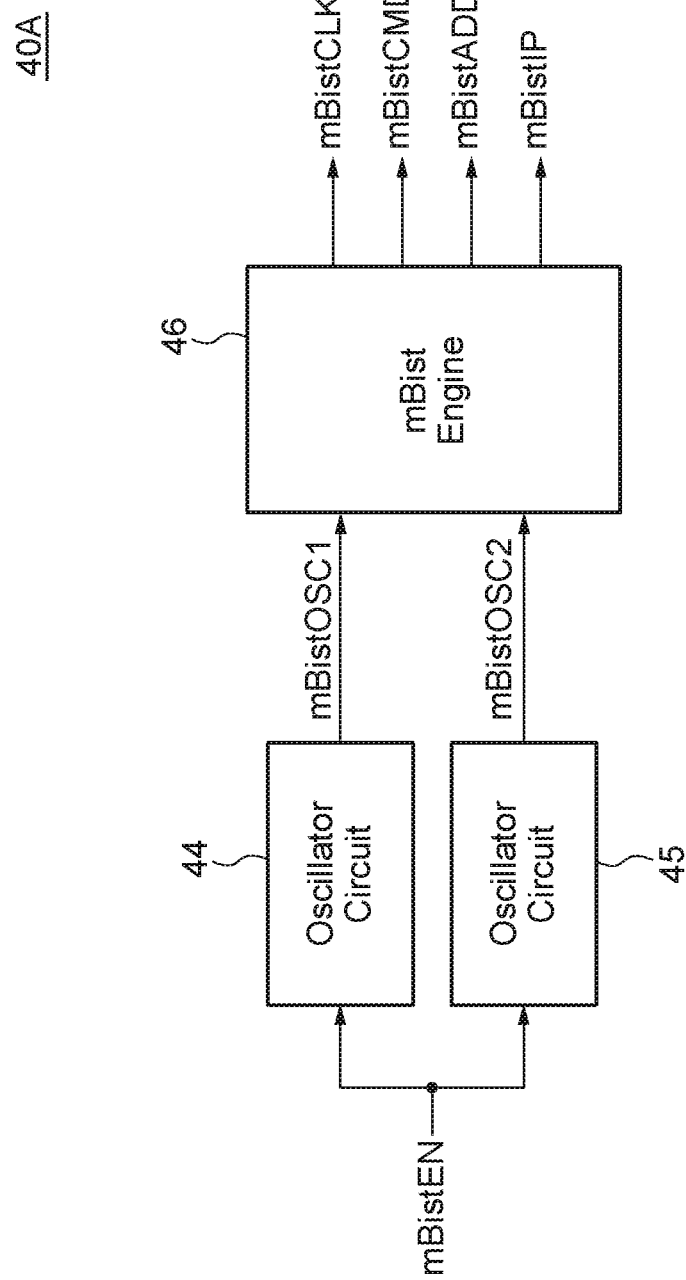
FIG. 5 is a block diagram of a test circuit according to an embodiment of the present disclosure.

FIG. 5 is a block diagram of a test circuit according to an embodiment of the present disclosure. In the embodiment described above, the clock signal mBistEXCLK obtained by dividing the internal clock signal ICLK and the oscillator signal mBistOSC are input to the mBist engine 43. However, two oscillator circuits 44 and 45 that respectively generate oscillator signals mBistOSC1 and mBistOSC2 having mutually different frequencies may be provided to supply these oscillator signals mBistOSC1 and mBistOSC2 to an mBist engine 46 as shown in FIG. 5. Further, the number of clock signals to be input to an mBist engine is not limited to two and three or more clock signals having mutually different frequencies may be input thereto.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
    first and second shift register circuits coupled in series, the first and second shift register circuits being configured to perform a shift operation of a trigger signal in synchronization with a clock signal; and
    a clock control circuit configured to set a frequency of the clock signal to a first frequency when the trigger signal is in the first shift register circuit and set a frequency of the clock signal to a second frequency different from the first frequency when the trigger signal is in the second shift register circuit.

2. The apparatus of claim 1, further comprising a first oscillator circuit configured to generate the clock signal having the first frequency.

3. The apparatus of claim 2, further comprising a clock divider circuit configured to generate the clock signal having the second frequency by dividing an external clock signal.

4. The apparatus of claim 2, further comprising a second oscillator circuit configured to generate the clock signal having the second frequency.

5. The apparatus of claim 1, further comprising a clock selector configured to be supplied with a first clock signal having the first frequency and a second clock signal having the second frequency,
    wherein the clock control circuit is configured to generate a selection signal, and
    wherein the clock selector is configured to select the first clock signal having the first frequency when the selection signal is in a first state and select the second clock signal having the second frequency when the selection signal is in a second state.

6. The apparatus of claim 1, further comprising:
    a memory cell array; and
    an access control circuit configured to access the memory cell array by using an internal address signal and a plurality of internal commands including first and second internal commands,
    wherein the trigger signal output from the first shift register circuit is used as the first internal command, and
    wherein the trigger signal output from the second shift register circuit is used as the second internal command.

7. An apparatus comprising:
    a first clock generator configured to generate, when activated, a first clock signal responsive to an external clock signal;
    a second clock generator configured to generate, when activated, a second clock signal irrespective of the external clock signal; and
    a BIST engine configured to produce a first internal command responsive to the first clock signal and a second internal command responsive to the second clock signal.

8. The apparatus of claim 7, wherein the BIST engine includes a first shift register circuit configured to perform a shift operation of a trigger signal in synchronization with the first clock signal.

9. The apparatus of claim 8, wherein the BIST engine further includes a second shift register circuit configured to perform a shift operation of the trigger signal in synchronization with the second clock signal.

10. The apparatus of claim 9, wherein the trigger signal output from the first shift register circuit is used as the first internal command and supplied to the second shift register circuit.

11. The apparatus of claim 10, wherein the trigger signal output from the second shift register circuit is used as the second internal command.

12. The apparatus of claim 11, wherein the first and second shift register circuits are configured to be supplied with the first clock signal in common during a first period.

13. The apparatus of claim 12, wherein the first and second shift register circuits are configured to be supplied with the second clock signal in common during a second period after the first period.

14. The apparatus of claim 7, wherein the first clock signal is different in frequency than the second clock signal.

15. The apparatus of claim 7, wherein the first clock generator includes a clock divider circuit configured to generate the first clock signal by dividing the external clock signal.

16. The apparatus of claim 7, wherein the second clock generator includes an oscillator circuit configured to generate the second clock signal.

17. The apparatus of claim 7, further comprising:
a memory cell array; and
an access control circuit configured to access the memory cell array by using an internal address signal and a plurality of internal commands including the first and second internal commands.

18. An apparatus comprising:
a memory cell array;
an access control circuit configured to access the memory cell array by using an internal address signal and a plurality of internal commands including a predetermined internal command; and
a test circuit configured to supply the internal address signal and the plurality of internal commands to the access control circuit,
wherein the test circuit is configured to operate in synchronization with a first clock signal having a first frequency before supplying the predetermined internal command and operate in synchronization with a second clock signal having a second frequency different from the first frequency after supplying the predetermined internal command.

19. The apparatus of claim 18, further comprising an oscillator circuit configured to generate the first clock signal.

20. The apparatus of claim 19, further comprising a clock divider circuit configured to generate the second clock signal by dividing an external clock signal.

* * * * *